(12) United States Patent
Miyajima et al.

(10) Patent No.: US 7,534,717 B2
(45) Date of Patent: May 19, 2009

(54) METHOD OF MANUFACTURING SEMICONDUCTOR DEVICE

(75) Inventors: Hideshi Miyajima, Kanagawa (JP); Keiji Fujita, Kanagawa (JP); Hideaki Masuda, Kanagawa (JP); Rempei Nakata, Kanagawa (JP); Miyoko Shimada, Ibaraki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 362 days.

(21) Appl. No.: 11/094,182

(22) Filed: Mar. 31, 2005

(65) Prior Publication Data

US 2005/0250311 A1 Nov. 10, 2005

(30) Foreign Application Priority Data

Apr. 1, 2004 (JP) .............................. 2004-109243

(51) Int. Cl.
*H01L 21/31* (2006.01)
*H01L 21/4763* (2006.01)

(52) U.S. Cl. ............... 438/623; 438/781; 257/E21.261; 257/E21.576

(58) Field of Classification Search ................ 438/618, 438/623, 781, 789, 790
See application file for complete search history.

(56) References Cited

U.S. PATENT DOCUMENTS 6,153,525 A * 11/2000 Hendricks et al. ........... 438/692
6,746,969 B2 6/2004 Shimada et al.
2002/0081863 A1 * 6/2002 Shimada et al. ............. 438/788
2003/0168251 A1 * 9/2003 Hawker et al. .............. 174/258
2004/0082180 A1 * 4/2004 Minamihaba et al. ....... 438/698
2004/0135254 A1 * 7/2004 Fujita et al. ................. 257/751

FOREIGN PATENT DOCUMENTS

| JP | 2001-345380 | 12/2001 |
| JP | 2002-329719 | 11/2002 |
| JP | 2003-289099 | 10/2003 |

OTHER PUBLICATIONS

IEEE 2003 International Interconnect Conference, Jun. 2-4, 2003.*
Kudo et al., "Copper Dual Damascene Interconnects With Very Low-K Dielectrics Targeting for 130 nm Node", IEEE, International Interconnect Technology Conference, pp. 270-273, (2000).
Onishi et al., "Advanced EB-Cure Process and Equipment for Low-K Dielectric", IEEE, International Symposium on Semiconductor Manufacturing Conference Proceedings, pp. 325-328, (2001).
Fujita et al., "Notable Improvement in Porous Low-K Film Properties Using Electron-Beam Cure Method", IEEE, International Interconnect Technology Conference, pp. 106-108, (2000).
Notification of Reason for Rejection issued by the Japanese Patent Office on Jan. 4, 2008, for Japanese Patent Application No. 2004-109243, and English-language translation thereof.

* cited by examiner

*Primary Examiner*—Alexander G Ghyka
(74) *Attorney, Agent, or Firm*—Finnegan, Henderson, Farabow, Garrett & Dunner, L.L.P.

(57) ABSTRACT

The formation of an interlayer insulating film above a substrate, the formation of an insulating film of an organic material on the interlayer insulating film thereafter, and the irradiation of the insulating film of an organic material and the interlayer insulating film with electron beams, thereby curing at least the insulating film of an organic material, are proposed.

1 Claim, 6 Drawing Sheets

METHOD OF MANUFACTURING SEMICONDUCTOR DEVICE

CROSS-REFERENCE TO RELATED APPLICATION

This application is based upon and claims the benefit of priority from prior Japanese Patent Application No. 2004-109243, filed on Apr. 1, 2004 in Japan, the entire contents of which are incorporated herein by reference.

BACKGROUND OF THE INVENTION

1. Field of the Invention

The present invention relates to a method of manufacturing a semiconductor device, and more particularly to a method of manufacturing a semiconductor device in which an insulating film is formed by irradiating a workpiece with electron beams to cure it.

2. Background Art

Recently, an insulating film is formed by applying a thin-film material on a semiconductor substrate by a spin coating method, etc., and thereafter curing the workpiece. The present inventor etc. have found that characteristics of an insulating film formed of a siloxane material can be improved by irradiating the siloxane material with an electron beam and simultaneously curing it, as disclosed in, for example, U.S. Pat. No. 6,746,969.

When a coated siloxane material layer is irradiated with electron beams and cured, thereby forming an interlayer insulating film, the following advantages can be obtained as compared with a case where a workpiece is only cured without being subjected to irradiation with an electron beam:

1). mechanical strength (hardness) can be improved to about two times that of conventional cases;

2). curing temperature can be decreased from about 400° C. in conventional cases to about 300° C.; and 3). curing time can be shortened from about 30 minutes in conventional cases to about two minutes.

When the aforementioned method is applied to a mask in a resist process, in addition to the above advantages, 4). resistance (selection ratio) of an etching mask can be improved to about two times that of conventional cases.

Recently, a logic LSI has a multilayer process structure including 5 or more layers. In such a case, if an interlayer insulating film material and an etching mask material are separately cured using electron beams, three electron beam irradiation operations are required for each layer (performed when forming an interlayer insulating film, forming a mask in a via hole formation step, and forming a mask in a embedded wiring (damascene wiring) formation step). In a simple curing process using only heat, a batch processing method can be used, in which about 50 semiconductor substrates can be processed at a time. However, if an electron beam irradiation is performed, a so-called single wafer processing method, in which only one semiconductor substrate is processed at a time, should be used. Accordingly, when a curing technique using electron beam irradiation is simply employed to cure each layer, the productivity is degraded, and the manufacturing cost is increased.

With respect to a curing operation by heat, a technique is proposed in which insulating films using two or more different kinds of materials are stacked and simultaneously cured, as disclosed in Japanese Patent Laid-Open Publication No. 2003-289099. In this technique, there is a problem in that when the shrinkage percentages of the layers constituting the stacked layer are considerably different from each other, cracks and layer separations are likely to occur.

Since the miniaturization of semiconductor devices has advanced, thereby decreasing the thickness of interlayer insulating films, it has become difficult to cure such thin interlayer insulating films using electron beam irradiation. In a curing operation using heat, it is possible to uniformly apply heat in a depth direction of the interlayer insulating film. In a curing operation using electron collisions caused by electron beam irradiation, it is necessary to decrease the energy (acceleration voltage) for injecting electrons to the surface of the layers. Otherwise, electrons pass through an interlayer insulating film, thereby adversely affecting layers and gates of transistors formed underneath the interlayer insulating film, and resulting in the degradation of the quality of the entire semiconductor device. For example, when electrons reach a layer located underneath the interlayer insulating film, a defect level is formed in a gate oxide layer, thereby shifting the threshold voltage of a transistor from a predetermined value, and resulting in that it is not possible to obtain desired transistor characteristics.

Furthermore, it is possible that a gas in the atmosphere is changed to a plasma by electron beam irradiation, thereby forming a damaged layer at the top surface of the interlayer insulating film due to the interaction of the plasma and the electrons, resulting in line-to-line leakage issues between wires.

SUMMARY OF THE INVENTION

A method of manufacturing a semiconductor device according to a first aspect of the present invention includes:

forming an interlayer insulating film above a substrate, and thereafter forming an insulating film of an organic material on the interlayer insulating film; and irradiating the insulating film of an organic material and the interlayer insulating film with electron beams, thereby curing at least the insulating film of an organic material.

A method of manufacturing a semiconductor device according to a second aspect of the present invention includes:

forming a low-k insulating film above a substrate;

forming a sacrifice layer of an insulating material on the low-k insulating film;

irradiating the low-k insulating film with electron beams via the sacrifice layer; and removing the sacrifice layer.

A method of manufacturing a semiconductor device according to a third aspect of the present invention includes:

forming a first low-k interlayer insulating film above a substrate;

forming a second low-k interlayer insulating film on the first low-k interlayer insulating film by a coating method; and irradiating the first and second low-k-interlayer insulating films with electron beams, thereby curing at least the second low-k interlayer insulating film.

DESCRIPTION OF THE EMBODIMENTS

Hereinafter, embodiments of the present invention will be described with reference to the accompanying drawings.

First Embodiment

A method of manufacturing a semiconductor device according to a first embodiment of the present invention will be described with reference to FIGS. 1A to 3B, which are sectional views showing steps of manufacturing a semiconductor device according to this embodiment.

Figure 1A:
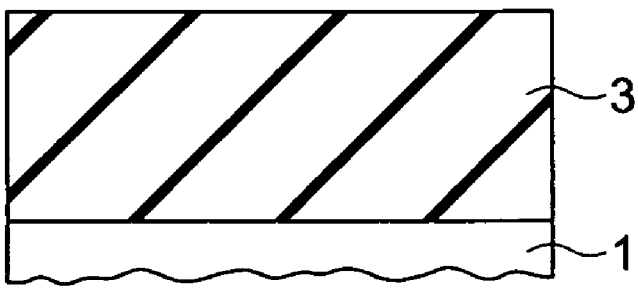
FIGS. 1A to 1C are sectional views showing steps of a method of manufacturing a semiconductor device according to a first embodiment of the present invention.

First, as shown in FIG. 1A, a low-k interlayer insulating film 3 having a relative dielectric constant of 3.0 or less is formed on a semiconductor substrate 1 by a coating method. In this case, a varnish obtained by dissolving into a solvent polymethylsiloxane comprising a methyl group introduced into silicon dioxide, polymethylsiloxane serving as a precursor of a low-k interlayer insulating film material, is coated on the semiconductor substrate 1, on which devices have been formed, by a spin coater. If it is possible to prepare a varnish by dissolving the low-k interlayer insulating film material itself into a solvent to form a uniform coated layer, it is not necessary to use a precursor thereof. The term "precursor" covers materials formed before the final product (herein the low-k interlayer insulating film) is formed. Thereafter, thermal processing is performed at a low temperature of 300° C. or less, the temperature being changed one or two times in stages, for about two minutes or less at each temperature. For example, the substrate 1 is placed on a hot plate, the temperature of which is kept at 80° C., and then thermally processed for two minutes. Thereafter, the substrate 1 is placed on a hot plate, the temperature of which is kept at 200° C., and then thermally processed for two minutes.

Figure 1B:
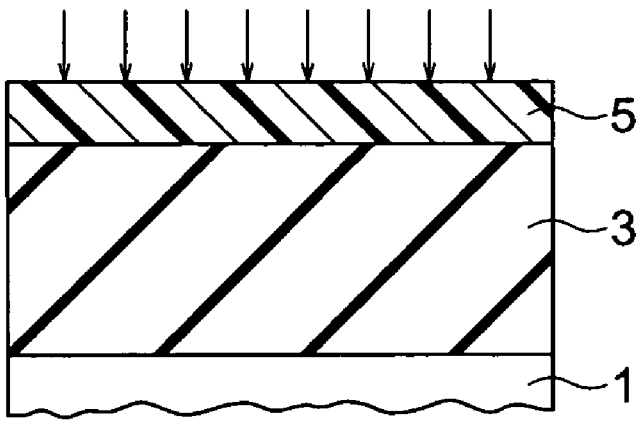

Next, as shown in FIG. 1B, an organic resin layer 5 is formed on the low-k interlayer insulating film 3. In this case, a polyarylene resin is used to form the organic resin layer 5. In order to form the organic resin layer 5, a varnish obtained by dissolving a polyarylene resin or a precursor thereof in a solvent is coated on the low-k interlayer insulating film 3, and then thermal processing is performed on the workpiece at a temperature of about 300° C. or less, the temperature being changed one or two times in stages, for about two minutes or less at each temperature. The organic resin layer 5 also has a low-k characteristic wherein the relative dielectric constant is 3.0 or less.

Then, with the organic resin layer 5 being stacked on the low-k interlayer insulating film 3, the organic resin layer 5 and the low-k interlayer insulating film 3 are irradiated with electron beams. At this time, it is possible to cure and harden the low-k interlayer insulating film 3 formed of polymethylsiloxane and placed below the organic resin layer 5 at the same time as the organic resin layer 5 by controlling the depth by which the electron beams are injected into the layers by adjusting the incident energy of the electron beams. Accordingly, the low-k interlayer insulating film 3 formed of polymethylsiloxane and the organic resin layer 5 being are cured and hardened by this manner has the following advantages as compared with the case where they are hardened by simple thermal processing.

1). mechanical strength (hardness) can be improved to about two times that of conventional cases;

2). curing temperature can be decreased from about 400° C. in conventional cases to about 300° C.;

3). curing time can be shortened from about 30 minutes in conventional cases to about two minutes; and 4). curing strength at interfaces between the low-k interlayer insulating film 3 and the upper and lower layers can be improved to about three times that of conventional cases.

It is desirable that the shrinkage percentage of each of the low-k interlayer insulating film 3 and the organic resin layer 5 at the time of the curing operation using electron beams be 15% or less. If the shrinkage percentage exceeds 15%, it is possible that fractures called "cracks" may form in the stacked layers. The shrinkage percentage herein means a value obtained by subtracting the thickness after the curing from the thickness before the curing, dividing the obtained value by the thickness before the curing, and multiplying the thus obtained value by 100.

Figure 1C:
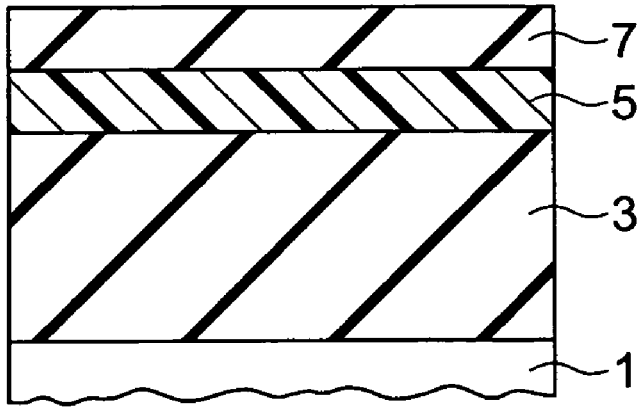

Next, as shown in FIG. 1C, a silicon dioxide layer 7 is formed on the organic resin layer 5 by a plasma CVD (Chemical Vapor Deposition) method using a $SiH_4/N_2O$ mixture gas, which is processed at a temperature of 370° C.

Figure 2A:
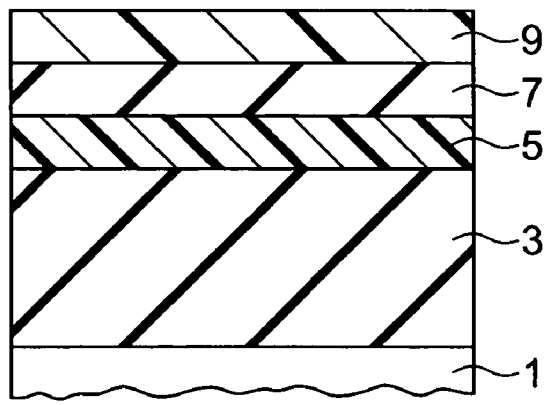
FIGS. 2A to 2C are sectional views showing steps of the method of manufacturing a semiconductor device according to the first embodiment of the present invention.
Figure 2B:
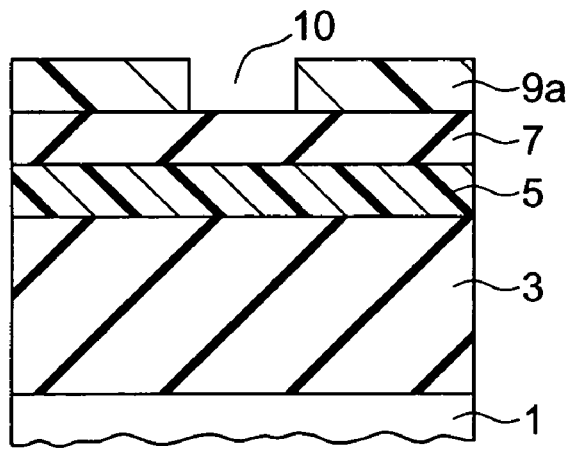
Figure 2C:
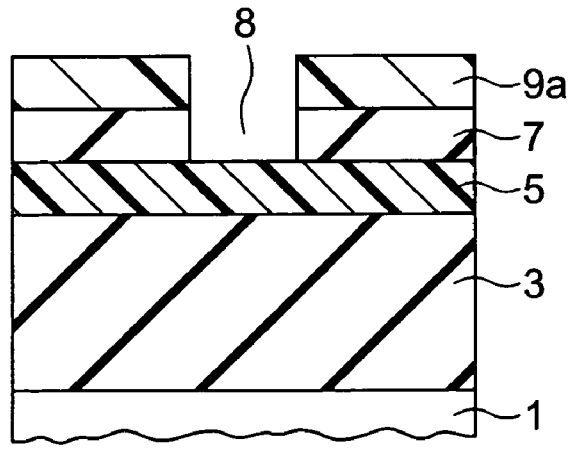

Subsequently, as shown in FIG. 2A, a photoresist 9 is coated on the silicon dioxide layer 7. Thereafter, as shown in FIG. 2B, a resist pattern 9a having an opening 10 is formed by patterning the photoresist 9. Then, as shown in FIG. 2C, the silicon dioxide layer 7 is patterned using $C_2F_6$ gas by an RIE (Reactive Ion Etching) method with the resist pattern 9a serving as a mask, thereby forming an opening 8, at the bottom of which the organic resin layer 5 is exposed.

Figure 3A:
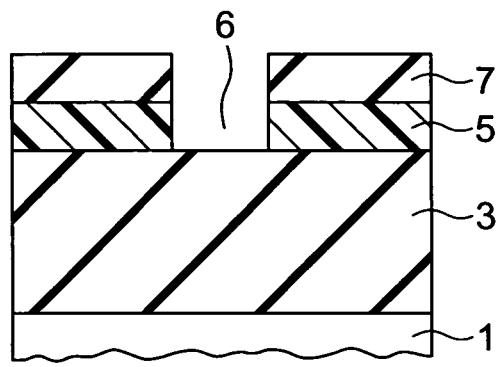
FIGS. 3A to 3B are sectional views showing steps of the method of manufacturing a semiconductor device according to the first embodiment of the present invention.

Then, as shown in FIG. 3A, the organic resin layer 5 is patterned by an RIE method using $NH_3$ gas, the silicon dioxide layer 7 serving as a mask, thereby forming an opening 6, at the bottom of which the low-k interlayer insulating film 3 is exposed. At the same time, the resist pattern 9a at the surface of the workpiece, which is formed of the same resin material as the organic resin layer 5 is removed.

Figure 3B:
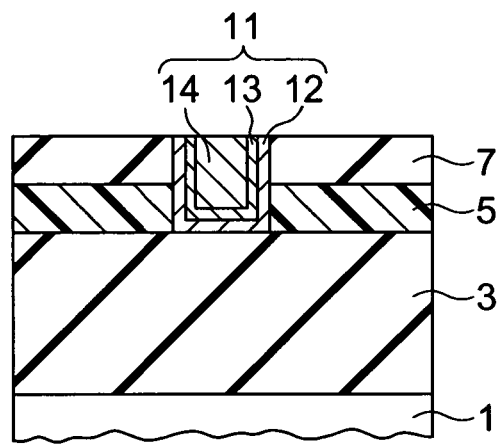

Subsequently, as shown in FIG. 3B, a single layer formed of a material selected from Ta, TaN, Ti, TiN, and WN, or a laminated layer formed by stacking materials selected from these is formed by a sputtering method so as to serve as a barrier metal 12. Thereafter, a thin film 13 called a "seed layer", which is formed of Cu, is formed on the barrier metal 12 by a sputtering method. Then, wiring 14 of Cu is formed by an electrolytic plating method. Subsequently, the unnecessary portions of the wiring 14, the thin film 13, and the barrier metal 12 are removed by a CMP (Chemical Mechanical Polishing) method, thereby forming embedded wiring 11.

As described above, according to this embodiment, an electron beam irradiation operation is performed, with an incident energy being controlled, on a workpiece in which the organic resin layer 5 is stacked on the low-k interlayer insulating film 3. Accordingly, it is possible to perform a property modification of the low-k interlayer insulating film 3 without causing damage to devices formed on the semiconductor substrate 1. At the same time, the bonding strengths of the interface between the low-k interlayer insulating film 3 and the organic resin layer 5, and the interface between the low-k interlayer insulating film 3 and the semiconductor substrate 1 are improved. Accordingly, it is possible to prevent an increase in manufacturing cost and degradation in product quality. Although the organic resin layer 5 is directly irradiated with electron beams, the property of the surface of the organic resin layer 5 is hardly changed since the organic resin layer 5 is formed of an organic material.

Figure 4A:
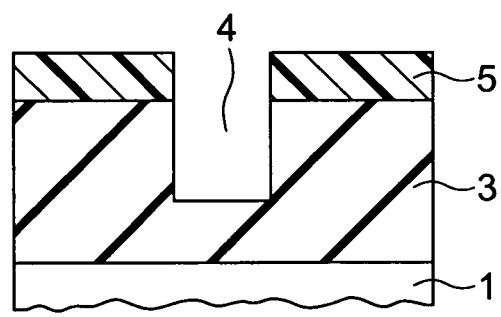
FIGS. 4A to 4B are sectional views showing steps of a method of manufacturing a semiconductor device according to a first modification of the first embodiment of the present invention.
Figure 4B:
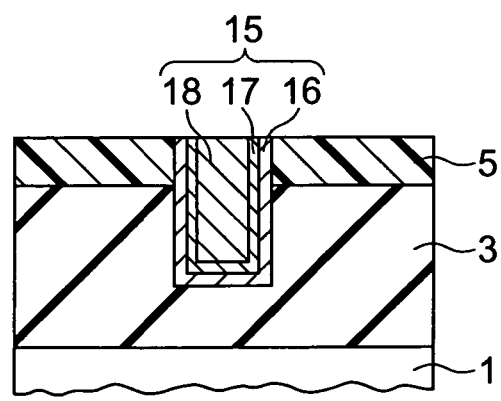

Although the opening 6 shown in FIG. 3A is used as a wiring groove for forming the embedded wiring 11 in this embodiment, in the state shown in FIG. 3A, it is possible to etch and remove the silicon dioxide layer 7 shown in FIG. 3A by an RIE method by using $C_2F_6$ gas as an etching gas, and simultaneously to form an opening 4 in the low-k interlayer insulating film 3, the opening 4 being used as a wiring groove, as shown in FIG. 4A. In this case, the low-k interlayer insulating film 3 of polymethylsiloxane can be patterned by using the organic resin layer 5 of polyarylene as a mask. At the same time, the silicon dioxide layer 7 located at the surface of the workpiece, which has Si—O bonds to form the skeleton as in the case of the organic resin layer 5, is removed. Thereafter, as shown in FIG. 4B, a barrier metal 16, a seed layer 17 of Cu, and wiring 18 of Cu are formed in the opening 4, thereby forming embedded copper wiring 15.

Figure 5A:
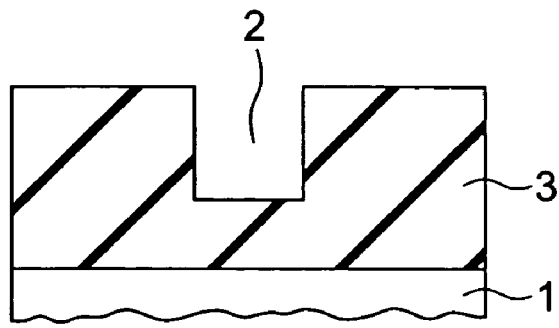
FIGS. 5A to 5B are sectional views showing steps of a method of manufacturing a semiconductor device according to a second modification of the first embodiment of the present invention.
Figure 5B:
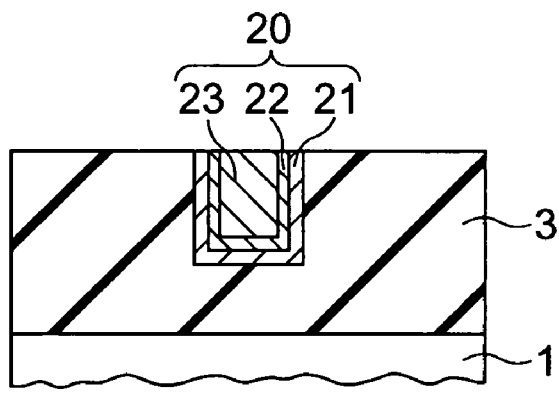

Furthermore, in the sate shown in FIG. 4A, it is possible to form an opening 2 in the low-k interlayer insulating film 3 by using $NH_3$ gas or the like as an etching gas for etching and removing the organic resin layer 5 serving as the resist mask shown in FIG. 4A by an RIE method, and to use the opening 2 as a wiring groove, as shown in FIG. 5A. In this case, only the organic resin layer 5 of polyarylene located at the surface of the workpiece is removed, and the low-k interlayer insulating film 3 of polymethylsiloxane including Si—O bonds to form the skeleton is not removed. A barrier metal 21, a seed layer 22 of Cu, and wiring 23 of Cu are formed in the opening 2 to form embedded wiring 20.

Figure 6:
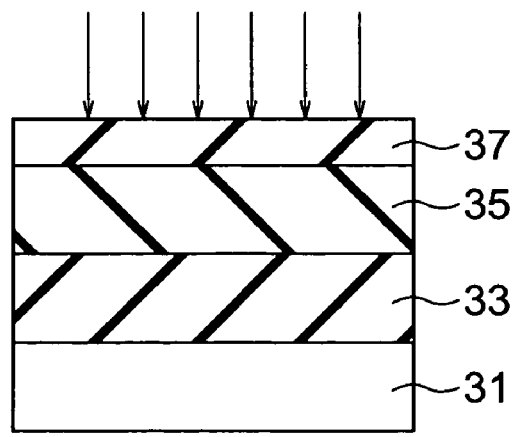
FIG. 6 is sectional view showing a step of a method of manufacturing a semiconductor device according to a third modification of the first embodiment of the present invention.

Although the electron beam irradiation is performed on the two stacked layers, i.e., the organic resin layer 5 and the low-k interlayer insulating film 3, in this embodiment as shown in FIG. 1B, the manner of performing the irradiation operation is not limited thereto. It is possible to obtain the same effect by stacking a low-k interlayer insulating film 33 having a relative dielectric constant of 3.0 or less, a low-k interlayer insulating film 35 having a relative dielectric constant of 3.0 or less, and a low-k interlayer insulating film 37 having a relative dielectric constant of 3.0 or less, i.e., to form a triple-layer structure as shown in FIG. 6, on a semiconductor substrate 31, on which devices have been formed, and by irradiating the workpiece with electron beams. Moreover, the same effect can be obtained by irradiating a mutilayer including four to five layers with electron beams. In these cases, it is preferable that an organic material be used to form the uppermost layer to which the electron beams are directly irradiated so that the surface thereof is not damaged by the electron beam irradiation.

Furthermore, although the workpiece is irradiated with electron beams after thermal processing is performed thereon at a low temperature up to about 300° C. for a short time in this embodiment, the manner of performing the curing and irradiation operation is not limited thereto. The aforementioned advantage 1), i.e., mechanical strength (hardness) can be improved to about two times that of a conventional case where no electron beam irradiation is performed, can be confirmed in the case where the workpiece is pre-cured at a temperature of about 400° C. for 30 to 60 minutes and then is irradiated with electron beams.

When curing in this embodiment is applied to a resist process, the advantage 2), i.e., dry etching resistance (dry etching selectivity) double can be obtained in addition to the advantage 1).

Although the application to the resist process is effective regardless of whether the resist mask is formed of a single layer or multiple layers, it is particularly effective when the resist mask is formed of multiple layers. When the workpiece is irradiated with electron beams and cured, it is possible to emit electron beams with heat being applied thereto.

In this embodiment, a low-k interlayer insulating film of polymethylsiloxane formed by a coating method serves as the interlayer insulating film 3. However, the material is not limited to polymethylsiloxane, as a low-k interlayer insulating film formed of any material including siloxane bonds has the same effect. The formation method is not limited to a coating method, as a CVD method or a vapor deposition polymerization method has the same effect.

Furthermore, although a polyarylene resin is used to form the organic resin layer 5 in this embodiment, any organic resin material, such as a fluorocarbon polymer, has the same effect.

Although a silicon dioxide layer deposited by a CVD method using $SiH_4/N_2O$ gas serves as the insulating film 7 in this embodiment, the material is not limited thereto but any material including siloxane bonds to form the skeleton has the same effect.

In this embodiment, at the time of performing a curing operation, an electron beam irradiation operation is also performed. When only thermal processing is performed without performing the electron beam irradiation operation, the processing time can be shortened and the throughput can be improved, though the resultant effects are not so good as compared with the case where the electron beam irradiation operation is also performed.

Second Embodiment

Next, a method of manufacturing a semiconductor device according to a second embodiment of the present invention will be described below with reference to FIGS. 7A to 7C, which are sectional views showing steps of manufacturing a semiconductor device according to this embodiment. The manufacturing method of this embodiment is used to form wiring by a damascene method as shown in FIGS. 7A to 7C.

First, an interlayer insulating film 43 is formed on a semiconductor substrate 41, on which devices have been formed. Herein, a low-k interlayer insulating film formed by a coating method serves as the interlayer insulating film 43, but the present invention is effective for a low-k interlayer insulating film formed by other method, e.g., a CVD method. A varnish obtained by dissolving an organic silicon-oxide into a solvent is coated on the semiconductor substrate 41 by a spin coater, and the solvent is evaporated at a low temperature of about 200° C., thereby forming the low-k interlayer insulating film 43 having a thickness of 100 nm and a relative dielectric constant of 3.0 or less, as shown in FIG. 7A.

Figure 7A:
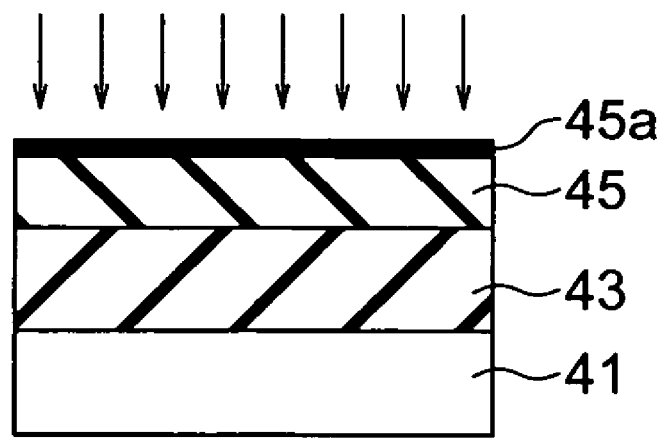
FIGS. 7A to 7C are sectional views showing steps of a method of manufacturing a semiconductor device according to a second embodiment of the present invention.
Figure 7B:
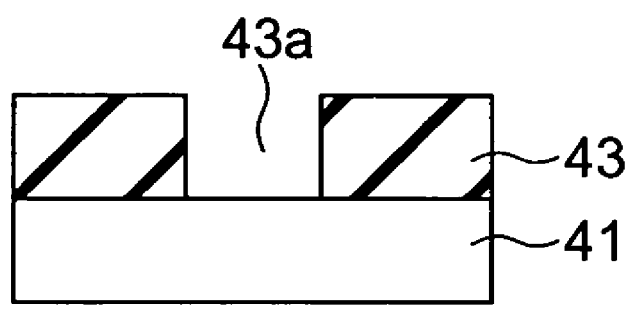
Figure 7C:
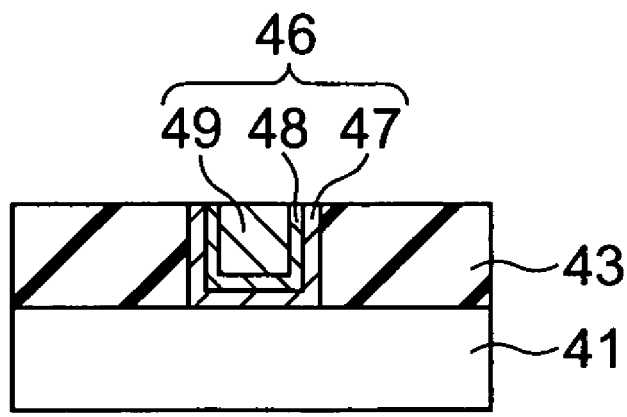

Next, a varnish obtained by dissolving a material including siloxane bonds into a solvent is coated on the low-k interlayer insulating film 43 by a spin coater, and a thermal processing operation of the same kind as that performed in the first embodiment is performed, thereby evaporating the solvent at a low temperature of, e.g., about 200° C. to form a silicon insulating layer 45 to serve as a sacrifice layer having a thickness of 100 nm, as shown in FIG. 7A. Subsequently, the silicon insulating layer 45 is irradiated with electron beams via the low-k interlayer insulating film 43 and cured. The conditions of the electron beam irradiation for, e.g., an organic silicon-oxide layer, are: Ar gas being introduced at 1,000 sccm; an acceleration voltage of 10 kV; a pressure of 10 Torr; and a dose amount of 0.5 mC/cm². If the sacrifice layer 45 is not formed under these conditions, damage is caused to devices, e.g., transistors, formed on the semiconductor substrate 41. Since the silicon insulating layer 45 is formed of an inorganic material, when an electron beam irradiation operation is performed, a damaged layer 45a is formed at the top surface of the silicon insulating layer 45 due to the influences of plasma formed by electron beams and the concentration of electrons, the energy of which is lost by being scattered by Ar gas.

Next, an etching operation is performed to remove the damaged layer 45a and the sacrifice layer 45. As long as the selection ratio with respect to the low-k interlayer insulating film 43 of an organic silicon-oxide material and the sacrifice layer 45 can be ensured, either dry etching or wet etching can be employed. In this embodiment, a case of wet etching will be described. An HF wet etching solution has a sufficient selection ratio with respect to the low-k interlayer insulating film 43 of an organic silicon-oxide material and the sacrifice layer 45. The sacrifice layer 45 is removed by processing the workpiece with a diluted aqueous solution having an HF concentration of 0.5 vol % for 5 minutes. Subsequently, an opening serving as a wiring groove is formed in the low-k interlayer insulating film 43 using a photolithography technique, as shown in FIG. 7B.

Next, using a sputtering technique, a barrier metal 47 of Ta having a thickness of 30 nm is formed. Thereafter, a seed layer 48 of Cu having a thickness of 50 nm is formed on the barrier metal 47 by Cu plating. Then, a wiring 49 of Cu is formed on the seed layer 48 by plating. Subsequently, thermal processing is performed at a temperature of 300° C. in order to improve the reliability of the wiring. Thereafter, using a CMP technique, Cu and Ta remaining on the top surface of the low-k interlayer insulating film 43 are removed, and the top surface is flattened, thereby forming embedded wiring 46, as shown in FIG. 7C.

As described above, according to this embodiment, a sacrifice layer is formed on a low-k interlayer insulating film, and the property of the insulating film is modified by irradiating the insulating film with electron beams from above the sacrifice layer. In this manner, it is possible to curb the entry of electrons with the existence of the sacrifice layer without decreasing the acceleration voltage very much. Accordingly, it is possible to modify the property of the low-k interlayer insulating film without adversely affecting the layer located underneath (in this embodiment, the semiconductor substrate). Since the sacrifice layer is removed in the etching step, this layer does not adversely affect the steps at later stages. The sacrifice layer can be left for a while and used as a mask when the interlayer insulating film is processed. Although it is possible that a damaged layer may be formed on the top surface of the hardened layer due to the interaction between electrons and plasma at the time of electron beam irradiation, thereby electrically adversely affecting wiring lines, this portion can be removed by processing the sacrifice layer. At this time, the bonding strength of each interface between layers can be improved.

Although a single layer is used to form the low-k interlayer insulating film of this embodiment, two or more stacked layers, e.g., the stacked layers shown in FIG. 6 with the uppermost layer, i.e. the organic low-k interlayer insulating film 37, being replaced by a sacrifice layer 37, can be used to form the low-k interlayer insulating film.

Furthermore, when the workpiece is irradiated with electron beams and cured in this embodiment, it is possible to heat the workpiece as well.

Third Embodiment

Figure 8A:
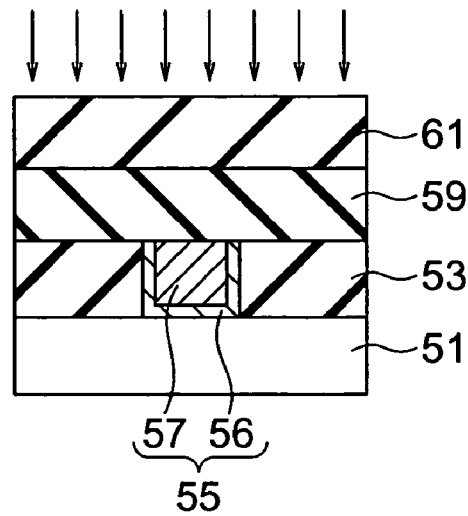
FIGS. 8A to 8C are sectional views showing steps of a method of manufacturing a semiconductor device according to a third embodiment of the present invention.
Figure 8B:
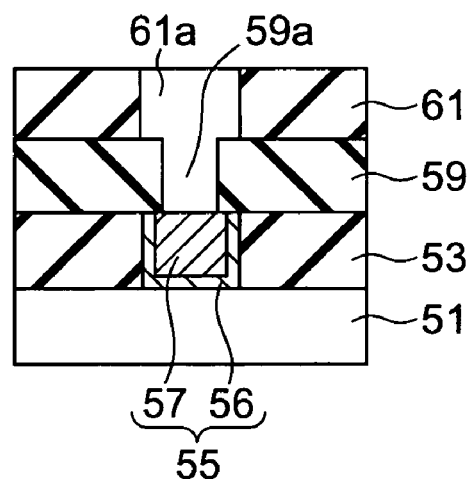
Figure 8C:
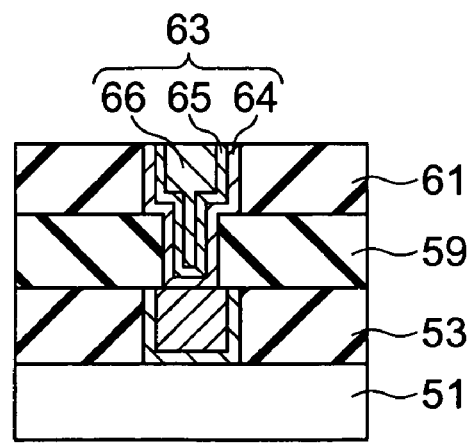

Next, a method of manufacturing a semiconductor device according to a third embodiment of the present invention will be described with reference to FIGS. 8A to 8C, which are sectional views showing steps of manufacturing a semiconductor device of this embodiment. As shown in FIGS. 8A to 8C, the manufacturing method of this embodiment is used to form wiring by a dual damascene method.

First, an interlayer insulating film 53 is formed on a semiconductor substrate 51, on which device have been formed. Then, a barrier metal 56 and Cu wiring 57 constituting embedded wiring 55 are formed in the interlayer insulating film 53. Subsequently, a low-k interlayer insulating film 59 of, e.g., an organic silicon-oxide material, covering the interlayer insulating film 53 and the embedded wiring 55 is formed by a CVD method. The deposition temperature is set to be lower than 350° C., and the RF power is set to be lower than that in a general CVD deposition case, thereby intentionally leaving unbonded portions in the layer. It is important to set the deposition temperature to be lower than that in a general plasma CVD case. Specifically, the deposition conditions in a case of an organic silicon-oxide layer are: 800 sccm with respect to $O_2$ gas; 3000 mgm with respect to OMCTS ($Si_4O_4C_8H_2$); 1000 sccm with respect to He gas; 2000 sccm with respect to $C_2H_4$ gas; a pressure of 7 Torr; and an RF power of 500 W.

Subsequently, a varnish obtained by dissolving into a solvent a precursor serving as a material of a low-k interlayer insulating film or the material of a low-k interlayer insulating film itself is applied to the low-k interlayer insulating film 59 by using a spin coater and the solvent is evaporated at a low temperature of about 200° C. by a thermal processing operation of the same kind of that performed in the first embodiment, thereby forming a low-k interlayer insulating film 61 of an organic resin. In this case, a polyarylene resin is used to form the organic resin. Thereafter, the low-k interlayer insulating film 61 and the low-k interlayer insulating film 59 are irradiated with electron beams, thereby curing and modifying the property of the low-k interlayer insulating film 61, and modifying the property of low-k interlayer insulating film 59 (FIG. 8A). For example, the conditions of the electron beam irradiation are: Ar gas being introduced at 1000 sccm; an acceleration voltage of 10 kV; a pressure of 10 Torr, and a dose amount of 0.5 mC/cm². In this manner, it is possible to modify the property of the low-k interlayer insulating film 61 formed by using a spin coater and the low-k interlayer insulating film 59 formed by a CVD method without causing damage to the low-k interlayer insulating film 59 so that they have such a low-k dielectric characteristic as a relative dielectric constant of 3.0 or less, and to considerably improve the bonding strength between the low-k interlayer insulating film 61 and the low-k interlayer insulating film 59. Since the low-k interlayer insulating film 61 is formed of an organic material, even if it is directly irradiated with electron beams, no damaged layer, which is mentioned in the descriptions of the second embodiment, is formed.

Next, a resist pattern having an opening for forming a via hole, which is not shown in the drawing, is formed on the low-k interlayer insulating film 61 using a photolithography technique. The low-k interlayer insulating films 61 and 59 are patterned by dry etching using the resist pattern as a mask, thereby forming a via hole 59*a* serving as a first opening. Subsequently, after the resist pattern is removed, a resist pattern having an opening for forming a wiring groove is formed by using a photolithography technique. The low-k interlayer insulating film 61 is dry etched using the resist pattern as a mask, thereby forming a wiring groove 61*a* serving as a second opening in the low-k interlayer insulating film 61, as shown in FIG. 8B.

Next, a barrier metal 64 of Ta having a thickness of 30 nm is formed by using a sputtering technique, a seed layer 65 of Cu having a thickness of 50 nm is formed on the barrier metal 64 by a plating method, and then wiring 66 of Cu is embedded by a plating method. Thereafter, thermal processing is performed at a temperature of 300° C. in order to improve the reliability of the wiring. Then, excessive portions of Cu and Ta of the barrier metal are removed by a CMP technique and the surface of the workpiece is flattened, thereby forming the embedded wiring 63, as shown in FIG. 8C.

As described above, according to this embodiment, it is possible to modify the property of the low-k interlayer insulating film and to improve the adhesion at the interface between different interlayer insulating films by using electron beams simultaneously. Generally, adhesion of a coated layer to a base layer (lower layer) thereof is poor. The main reason for this is that if a cured operation using heat is performed after a coated layer is formed, it is difficult to provide good adhesion properties because no bonds are provided to bond the coated layer to the base layer. However, if electron beams are used in the curing, rebondage of bonds is caused due to the electron energy, thereby providing adhesion between the lower layer and the coated layer with bonds to improve the adhesion properties considerably. For example, it is possible to cure a workpiece and to improve the adhesion properties of the workpiece simultaneously by performing a curing operation using electron beam irradiation even in a case where a coated layer includes two stacked layers.

In the third embodiment, when the workpiece is irradiated with electron beams and cured, it is possible to heat the workpiece.

Depending on the type of a CVD layer, sometimes bonds are damaged by electron beam irradiation, thereby degrading the chemical-resistant or plasma-resistant property of the layer. In order to avoid this, a CVD layer can be formed at a low temperature so as not to advance the formation of bonds at the time of the CVD layer formation. The formation of bonds can be advanced later when electron beam irradiation is performed Assuming that a CVD layer and a coated layer are stacked, when attempting to improve the adhesion properties between the coated layer and the CVD layer located below the coated layer at the time of the curing of the coated layer, it is possible that the CVD layer located below is damaged. In order to solve this problem, it is possible to modify the properties of both layers and to improve the adhesion properties therebetween by first forming a CVD layer at a low temperature, then forming a coated layer, and then irradiating the layers with electron beams, as in the case of this embodiment.

As described above, according the respective embodiments of the present invention, it is possible to curb an increase in manufacturing cost and degradation in product quality.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

The invention claimed is:

1. A method of manufacturing a semiconductor device comprising:
    forming a first low-k interlayer insulating film of an organic silicon-oxide material above a substrate;
    forming a second low-k interlayer insulating film of a polyarylene resin on the first low-k interlayer insulating film by a coating method;
    irradiating the first and second low-k interlayer insulating films with electron beams, thereby curing at least the second low-k interlayer insulating film;
    patterning the second and first low-k interlayer insulating films to form a first opening, and patterning the second low-k interlayer insulating film to form a second opening connected to the first opening, the second opening being wider than the first opening; and
    filling the first and second openings with a metal to form embedded wiring.

* * * * *